United States Patent [19]
Vest et al.

[11] Patent Number: 5,767,734
[45] Date of Patent: Jun. 16, 1998

[54] HIGH-VOLTAGE PUMP WITH INITIATION SCHEME

[75] Inventors: William B. Vest, Santa Clara; Myron W. Wong, San Jose, both of Calif.

[73] Assignee: Altera Corporation, San Jose, Calif.

[21] Appl. No.: 576,741

[22] Filed: Dec. 21, 1995

[51] Int. Cl.$^6$ .................. H03K 17/10; H03K 17/687
[52] U.S. Cl. .................. 327/536; 327/589; 365/189.09
[58] Field of Search .................. 327/536, 589, 327/390, 157, 148, 537, 126; 365/226, 189.09, 185.23

[56] References Cited

U.S. PATENT DOCUMENTS

| | | | |
|---|---|---|---|
| 4,609,986 | 9/1986 | Hartmann et al. | 364/200 |
| 4,617,479 | 10/1986 | Hartmann et al. . | |
| 4,636,657 | 1/1987 | Reddy | 327/589 |
| 4,677,318 | 6/1987 | Veenstra et al. . | |
| 4,689,495 | 8/1987 | Liu | 327/108 |
| 4,703,196 | 10/1987 | Arakawa | 327/126 |
| 4,713,792 | 12/1987 | Hartmann et al. | 364/900 |
| 4,769,784 | 9/1988 | Doluca et al. | 327/537 |
| 4,829,482 | 5/1989 | Owen | 365/185.23 |
| 4,871,930 | 10/1989 | Wong et al. . | |
| 4,899,067 | 2/1990 | So et al. . | |
| 4,912,342 | 3/1990 | Wong et al. . | |
| 5,036,229 | 7/1991 | Tran | 327/536 |
| 5,043,858 | 8/1991 | Waatanabe | 327/536 |
| 5,121,006 | 6/1992 | Pedersen et al. . | |
| 5,196,739 | 3/1993 | Sandhu et al. | 327/536 |
| 5,216,290 | 6/1993 | Childers | 327/390 |
| 5,241,224 | 8/1993 | Pedersen et al. . | |
| 5,247,208 | 9/1993 | Nakayama | 327/537 |
| 5,260,610 | 11/1993 | Pedersen et al. . | |
| 5,260,611 | 11/1993 | Cliff et al. . | |
| 5,350,954 | 9/1994 | Patel . | |
| 5,381,051 | 1/1995 | Morton | 327/390 |
| 5,394,372 | 2/1995 | Tanaka et al. | 327/536 |
| 5,426,333 | 6/1995 | Maeda | 327/536 |
| 5,495,436 | 2/1996 | Callahan | 327/536 |
| B1 4,617,479 | 9/1993 | Hartmann et al. . | |

*Primary Examiner*—Timothy P. Callahan
*Assistant Examiner*—Terry L. Englund
*Attorney, Agent, or Firm*—Townsend and Townsend and Crew LLP

[57] ABSTRACT

A high voltage pump with an initiation scheme to achieve voltages above VDD. In response to a pulse signal, an initiation voltage is placed on a first node (515) of a voltage pump to initiate pumping action. The initiation voltage is passed through a transistor (545) coupled between a high voltage output node (415) and the first node (515) of the voltage pump. The first node (515) is coupled through a capacitor (510) to an oscillator (405) which charges the first node (515). A high voltage is produced at the high voltage output node (415). The initiation scheme may be applied to one-stage and multiple-stage voltage pumps.

15 Claims, 7 Drawing Sheets

HIGH-VOLTAGE PUMP WITH INITIATION SCHEME

BACKGROUND OF THE INVENTION

This invention relates to the field of integrated circuits (also known as "chips"). More specifically, the present invention is a system for generating high voltages for an integrated circuit, especially useful for enhancing and speeding the critical path and also programming the memory cells of the integrated circuit.

Many integrated circuits require high voltages. For example, there are numerous integrated circuits with electrically programmed (or erased) memory cells such as programmable logic devices (PLDs) and EPROM, EEPROM, and Flash memories. These may be fabricated using technologies including electrically programmable read-only memory (EPROM) cells, electrically erasable programmable read-only memory (EEPROM) cells, Flash, antifuse, as well as many others. Many times, these memories use cells having floating gates. To program these cells, high voltages are used to transfer charge to the floating gates through the silicon dioxide by various physical mechanisms such as avalanche injection, channel injection, quantum-mechanical tunneling, and other phenomena. To erase the cells, for EEPROM and Flash memory cells, charge is electrically removed from the floating gate using high voltages; while for EPROM memory cells, charge is removed from the floating gates by exposing the cells to radiation, such as ultraviolet light. After erasure, the memory cells may be reprogrammed. Moreover, EPROM, EEPROM, and Flash memory cells may be programmed, erased, and reprogrammed many times.

Typically, the VDD (or VCC) of the integrated circuit is used for the normal (e.g., nonprogramming) operation of these memory cells. VDD is usually 5 volts, although 3.3-volt supplies are also common. As device and feature sizes on integrated circuits continue to shrink, future supply voltages may be reduced even further to, for example, 2.5 volts.

To program (and in some case, to erase) these memory cells, however, a higher potential than VDD is usually needed. Depending on the processing technology used, the internal integrated circuit voltages used to program these memory cells may be from 7 volts to 20 volts or more. For some integrated circuits, these high voltages are generated externally or off-chip. However, numerous charge pumping circuits are known for generating high potentials from a lower potential to provide internally generated high voltages.

Further, these high voltage generators may be used during normal chip operation to provide high voltages to critical path and other circuitry to enhance and speed-up the operation of many integrated circuits, including memories, microprocessors, application specific integrated circuits (ASICs), and programmable logic devices (PLDs). PLDs are well known to those in the electronic art. Such programmable logic devices are commonly referred as PALs (Programmable Array Logic), PLAs (Programmable Logic Arrays), FPLAs (Field Programmable Logic Arrays), PLDs (Programmable Logic Devices), EPLDs (Erasable Programmable Logic Devices), EEPLDs (Electrically Erasable Programmable Logic Devices), LCAs (Logic Cell Arrays), FPGAs (Field Programmable Gate Arrays), and the like. Such devices are used in a wide array of applications where it is desirable to program standard, off-the-shelf devices for a specific application. Such devices include, for example, the well-known, Classic™, and MAX® 5000, MAX® 7000, and FLEX® 8000 EPLDs made by Altera Corp.

PLDs are generally known in which many logic array blocks (LABs) are provided in a two-dimensional array. Further, PLDs have an array of intersecting signal conductors for programmably selecting and conducting logic signals to, from, and between the LABs. LABs contain a number of individual programmable logic elements (LEs) which provide relatively elementary logic functions such as NAND, NOR, and exclusive OR. The configuration of these PLDs are typically controlled by way of programmable memory cells, often requiring high voltage circuitry for programming. These cells include DRAM, SRAM, EPROM, EEPROM, and Flash memories. As integrated circuits become smaller and denser, it becomes possible to put greater numbers of programmable logic elements, and consequently more programmable memory cells, onto one integrated circuit. Hence, it becomes increasingly important to improve the techniques and architectures used for programming the programmable elements and enhancing the performance of PLDs.

Therefore, while existing high voltage pumping schemes have met with substantial success, such schemes also meet with certain limitations. In particular, such on-chip charge pumping circuits and voltage generators may consume significant amounts of power, often are relatively difficult to design and fabricate, operate somewhat inefficiently, may interfere with the operation of other devices on the integrated circuit, and may also be quite large, requiring a considerable amount of substrate area.

As can be seen, an improved technique for generating high voltages is needed, especially a scheme with improved efficiency, enhanced operating characteristics, and reduced size.

SUMMARY OF THE INVENTION

The present invention is a high voltage pump with an initiation scheme to achieve high voltages above VDD. The present invention may be used in many different types of integrated circuits, including microprocessors, memories, programmable logic devices, and application specific integrated circuits. In the present invention, in response to an initiation signal, an initiation voltage is placed on a first node of a voltage pump to initiate pumping action. The initiation voltage is passed through a transistor coupled between a high voltage output node and first node of the voltage pump. In one embodiment, the initiation signal is a pulse signal. The first node is coupled through a capacitor to an oscillator which charges the first node. With each iteration of the oscillator, the first node is charged and charge is passed from the first node to a high voltage node. The voltage level at the high voltage node gradually increases to a voltage level above VDD. In one embodiment of the present invention, the high voltage level is limited by a threshold voltage of a transistor. In another embodiment, the high voltage level is tracked to another high voltage level on the integrated circuit. The initiation scheme of the present invention may be applied to one-stage and multiple-stage voltage pumps.

The initiation scheme of the present invention allows the design of high voltage pumps where the transistor devices are fabricated similarly to other transistor devices on the integrated circuit. The transistor devices of the integrated circuit are not specially processed. In particular, the transistor devices do not have additional implants or absence of implants to adjust their threshold voltages. This also provides the high voltage pump better tolerance to process and other variations.

In accordance with the teachings of this invention, a method of generating voltages on an integrated circuit is disclosed, including the steps of: generating a pulse signal; transferring an initiation voltage to a first node in response to the pulse signal; charging the first node with the initiation voltage; and generating a clock signal, alternating between a first voltage level and a second voltage level, where the initiation voltage is at least a third voltage level and the first voltage level is above the second voltage level. Further steps include: charging the first node with the clock signal; transferring a charge of the first node to a second node; and producing a fourth voltage level at the second node by repeating the steps of charging the first node and transferring charge to the second node, where the fourth voltage level is above the first voltage level.

Furthermore, in a further embodiment of the present invention, the voltage pump circuit includes: a first transistor, coupled between a VPP node and a first node, where a gate of the first transistor is coupled to an output node; a second transistor, coupled between the output node and the first node, where a gate of the second transistor is coupled to a pulse signal node; a third transistor, coupled between the VPP node and the output node, where a gate of the third transistor is coupled to the output node; a fourth transistor, coupled between the first node and the output node, where a gate of the fourth transistor is coupled to the first node; and a capacitor, coupled between the first node and a control signal node.

Other objects, features, and advantages of the present invention will become apparent upon consideration of the following detailed description and the accompanying drawings, in which like reference designations represent like features throughout the figures.

DETAILED DESCRIPTION OF THE SPECIFIC EMBODIMENTS

Figure 1:
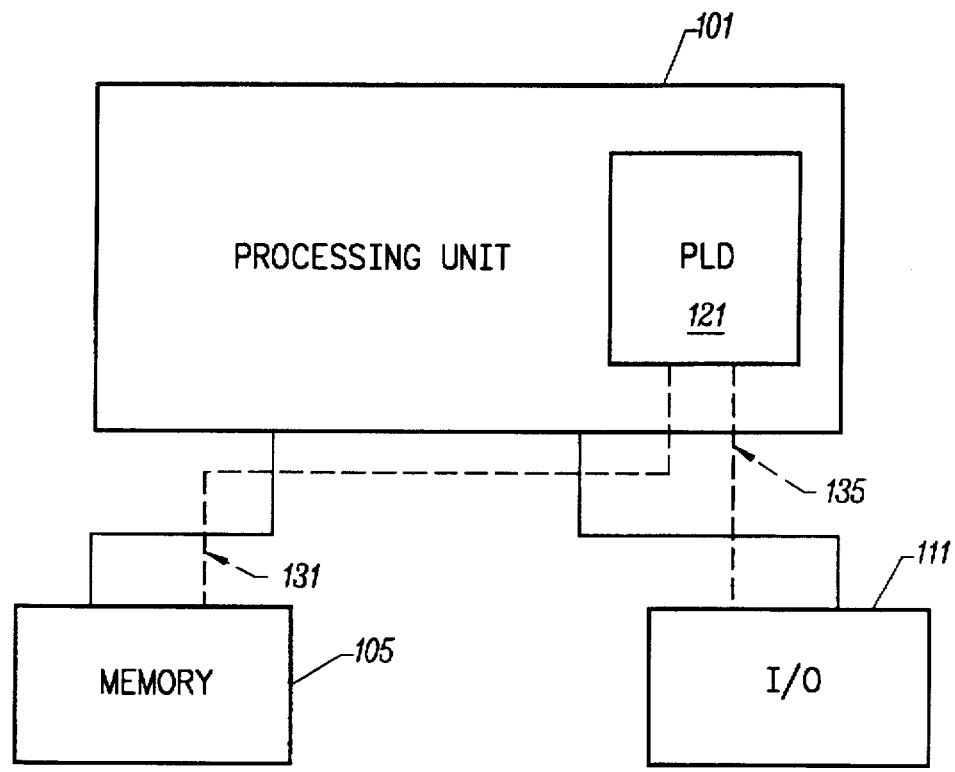
FIG. 1 is a block diagram of a digital system incorporating the present invention.

FIG. 1 shows a block diagram of a digital system within which the present invention may be embodied. In the particular embodiment of FIG. 1, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, the system may be a general purpose computer, a special purpose computer (such as telecommunications equipment) optimized for an application-specific task such as programming PLD 121, or a combination of a general purpose computer and auxiliary special purpose hardware.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system.

In some embodiments, processing unit 101 may even be a computer system. In one embodiment, source code may be stored in memory 105, compiled into machine language, and executed by processing unit 101. Processing unit 101 need not contain a CPU and in one embodiment, instructions may be executed by one or more PLDs 121. Instead of storing source code in memory 105, only the machine language representation of the source code, without the source code, may be stored in memory 105 for execution by processing unit 101. Memory 105 may be a random access memory (RAM), read only memory (ROM), fixed or flexible disk media, PC Card flash disk memory, tape, or any other storage retrieval means, or any combination of these storage retrieval means.

Processing unit 101 uses I/O 111 to provide an input and output path for user interaction. For example, a user may input logical functions to be programmed into programmable logic device 121. I/O 111 may be a keyboard, mouse, track ball, digitizing tablet, text or graphical display, touch screen, pen tablet, printer, or other input or output means, or any combination of these means. In one embodiment, I/O 111 includes a printer used for printing a hard copy of any processing unit 101 output. In particular, using I/O 111, a user may print a copy of a document prepared using a word processing program executed using processing unit 101. In other cases, a user may print out a copy of the source code or a listing of the logical functions contained within PLD 121.

PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
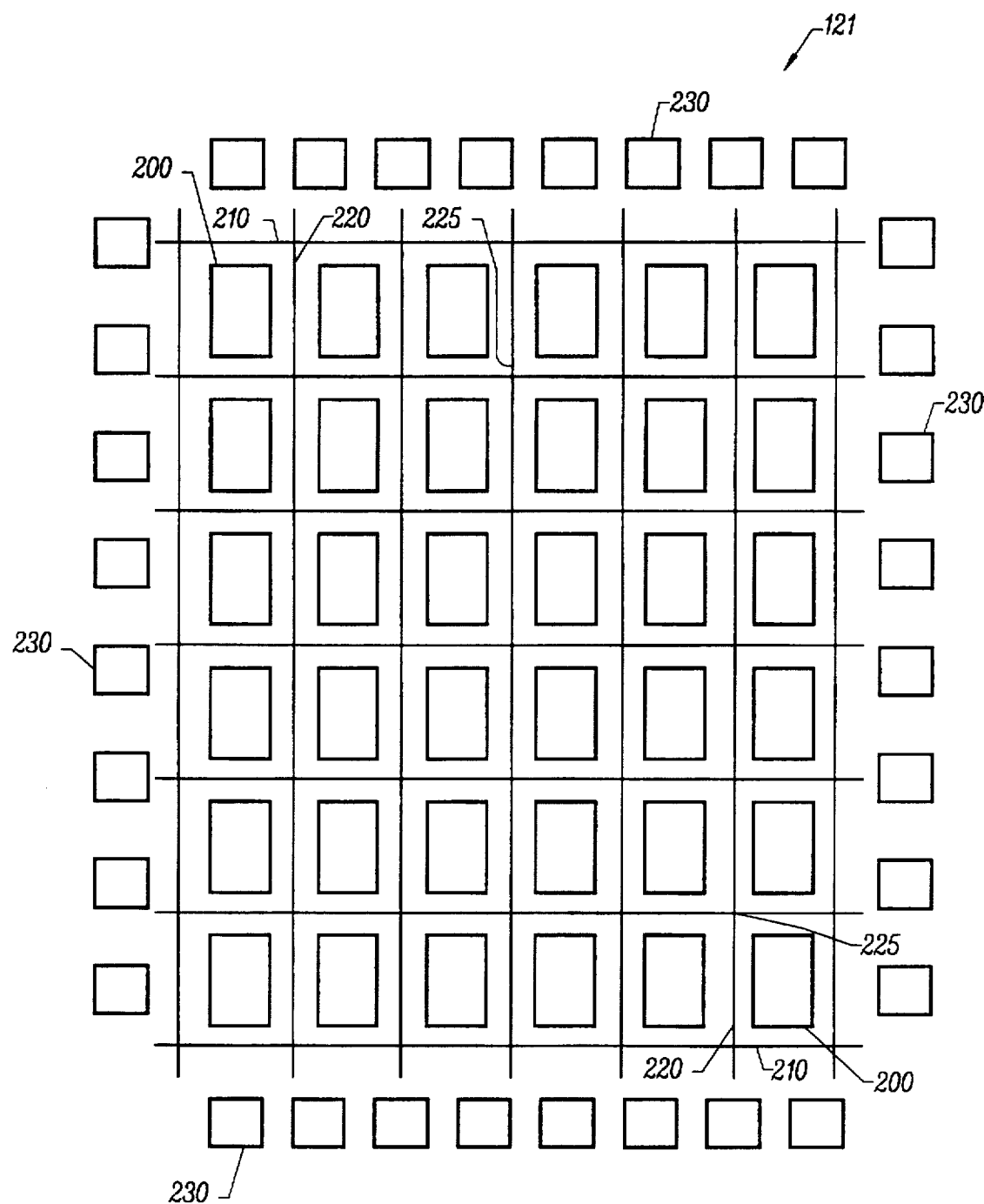
FIG. 2 is a block diagram showing the overall architecture of a programmable logic device incorporating the present invention.

FIG. 2 is a simplified block diagram of the overall internal architecture and organization of PLD 121 of FIG. 1. Many details of PLD architecture, organization, and circuit design are not necessary for an understanding of the present invention and such details are not shown in FIG. 2.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB will be described in more detail below in connection with FIG. 3. PLDs may contain any arbitrary number of LABs, more or less than the PLD 121 shown in FIG. 2. Some PLDs may even contain a single LAB. However, generally in the future, as technology advances and improves, programmable logic devices with even greater numbers of logic array blocks will undoubtedly be created.

Furthermore, LABs 200 need not be organized in a square or rectangular matrix. While a rectangular or square array is generally an efficient layout structure, any arrangement of LABs inside the PLD may be conceived. For example, the array may be organized in a five-by-seven or a twenty-by-seventy matrix of LABs. Furthermore, in some circumstances, some number of LABs may be replaced by different programmable structures.

LAB 200 has inputs and outputs (not shown) which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line represents a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Also, in some embodiments, intersection 225 may have programmable drivers for selecting the signal from a conductor in one direction and buffer the signal and drive it onto one of the alternate conductors in the same or different direction. Moreover, GH 210 and GV 220 conductors may make multiple connections to other GH 210 and GV 220 conductors. Various GH 210 and GV 220 conductors may be programmably connected together to create a signal path from a LAB 200 at one location on PLD 121 to another LAB 200 at another location on PLD 121. Furthermore, an output signal from one LAB 200 can be directed into the inputs of one or more LABs 200. Also, using the global interconnect, signals from a LAB 200 can be fed back into the same LAB 200. In other embodiments or the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

The global interconnect may contain long and segmented conductors. Long conductors run the entire length or width of PLD 121. In particular, long conductors may programmably couple LABs along a length or width of PLD 121. Segmented conductors are for shorter length interconnections. For example, segmented conductors may include double lines for interconnections between two LABs 200. Other segmented conductors include, among other, triple lines, quadruple lines, quintuple lines, sextuple lines, and other similar interconnection resources. Furthermore, at intersections 225, segmented conductors may be programmably coupled (or programmably uncoupled) to other long or segmented conductors, in the same or different direction. Intersection 225 may sometimes be referred to as a "switch box." As an example, a double line may be programmably coupled to other double, long, or segmented lines, in the same or different direction, at intersections 225.

The PLD architecture in FIG. 2 further shows at the peripheries of the chip, input-output drivers 230. Input-output drivers 230 are for interfacing the PLD to external, off-chip circuitry. FIG. 2 shows thirty-two input-output drivers 230; however, a PLD may contain any number of input-output drivers, more or less than the number depicted. Each input-output driver 230 is configurable for use as an input driver, output driver, or bidirectional driver.

Figure 3:
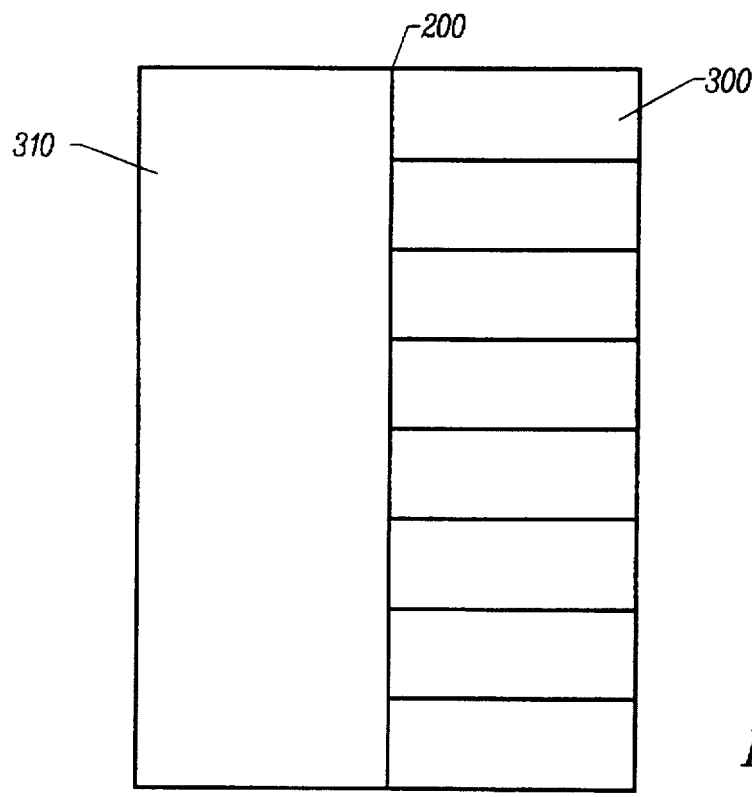
FIG. 3 is a simplified block diagram of a logic array block (LAB) of a programmable logic device.

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight. In a further embodiment of the present invention, LAB 200 has two "banks" of eight LEs for a total of sixteen LEs, where each bank has common inputs, but separate outputs and control signals. In some embodiments, LAB 200 includes carry chains.

A general overview of LE 300 is presented here, sufficient to provide a basic understanding of LAB 200. LE 300 is the smallest logical building block of a PLD. Signals external to the LAB, such as from GHs 210 and GVs 220, are programmably connected to LE 300 through local interconnect structure 310, although LE 300 may be implemented in many architectures other than those shown in FIGS. 1–3. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220. Through local interconnect structure 310 and local feedback, LEs 300 are programmably connectable to form larger, more complex logical functions than can be realized using a single LE 300. Furthermore, because of its reduced size and shorter length, local interconnect structure 310 has reduced parasitics compared to the global interconnection structure. Consequently, local interconnect structure 310 generally allows signals to propagate faster than through the global interconnect structure.

Figure 4:
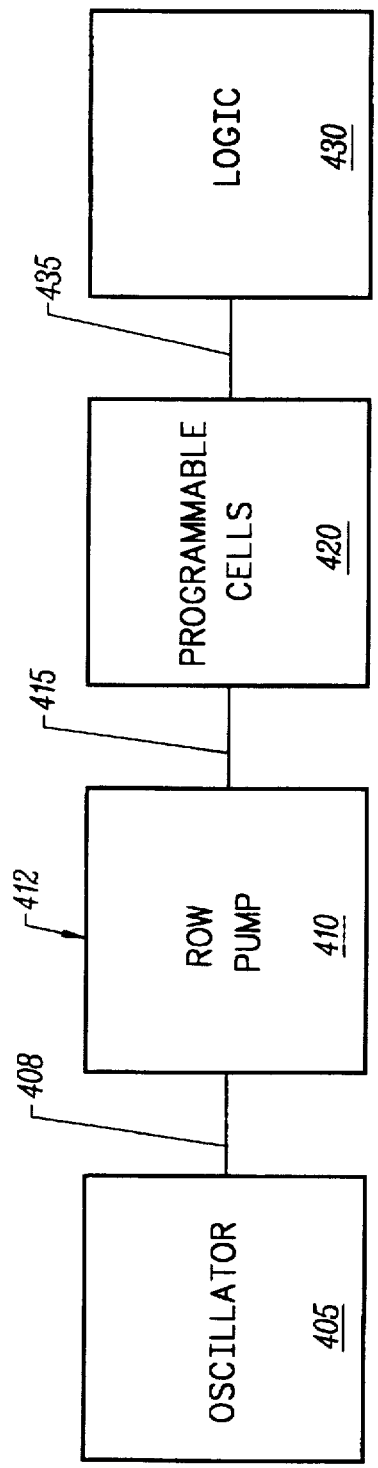
FIG. 4 is a simplified block diagram of a high voltage scheme for an integrated circuit.

FIG. 4 shows a simplified block diagram of an integrated circuit incorporating high voltage circuitry. This integrated circuit may be a memory, programmable logic device, microprocessor, or other integrated circuit. For example, this integrated circuit may be used to implement the digital system shown in FIG. 1. The present invention may be embodied in processing unit 101, memory 105, I/O 111, or PLD 121.

An integrated circuit receives power from a first voltage source (not shown), having a first voltage level, and a second voltage source (not shown), having a second voltage level. The first voltage source is typically at a voltage level above that of the second voltage source. The second voltage source is at approximately VSS or ground. The first voltage source is generally VDD, the supply voltage for the integrated circuit. Typically, the first voltage source (or VDD) will be at a voltage level of approximately 5 volts. However, as devices on integrated circuits become smaller and denser, the first voltage source may be at a voltage less than 5 volts, such as 3.3 volts. As integrated circuit technology continues to improve, supply voltages for future integrated circuits may be further reduced to, for example, approximately 2.5 volts. Consequently, the first voltage source may be at 2.5 volts in the future.

An oscillator 405 generates control signal 408, which is coupled to a row pump 410. Control signal 408 is typically a periodic, alternating signal, switching between the first voltage level and the second voltage level. For example, control signal 408 may be a clock signal. In response to control signal 408 and a pulse (or initiation) signal 412, row pump 410 generates a high voltage output at an output node 415. In a further embodiment, an external high voltage will be supplied to row pump 410, and row pump 410 will enhance or additionally boost this voltage. Pulse signal 412 is used to initiate operation of row pump 410. A more detailed description of pulse signal 412 is given below. The high voltage output at output node 415 is at a voltage level above the first voltage level. Output node 415 is coupled to programmable cells 420 and logic circuit 430 to provide high voltages for these components of the integrated circuit. Typically, the high voltage level at output node 415 is selected so it is sufficient to program (or erase) programmable cells 420 or interface with logic circuits 430, but without overstressing the devices of the integrated circuit. The high voltage level typically ranges from 7 volts to 20 volts.

As described earlier, high voltages are used for many different purposes within an integrated circuit. For example, row pump 410 may be coupled to a plurality of programmable cells 420 as in the case for a memory, PLD, or other similar integrated circuit. Among other uses, programmable cells 420 may be used to store data. Programmable cells 420 may be implemented using, among others, EPROM, EEPROM, and Flash cells. Row pump 410 will generate the high voltages used to program programmable cells 420. Depending on the type of programmable cells 420 used, these high voltages may be used also to erase these programmable cells 420.

Furthermore, programmable cells 420 may be coupled or programmably coupled to logic circuits 430 such as indicated by a connection 435. Programmable cells 420 may hold the configuration information for the logic circuits 430, which perform the boolean, logical, combinatorial, sequential, and other functions of the integrated circuit. Furthermore, logic circuits 430 may even contain the circuity for controlling the programming circuitry and row pump 410 of the chip. As an example, in an implementation of PLD 121, logic circuits 430 may include LABs 200, LEs 300, programmable intersections 225, and GH 210 and GV 220 conductors. Then, row pump 410 produces the high voltages used to program the programmable cells 420 controlling the configuration and routing of the LABs 200, LEs 300, programmable intersections 225, GH 210 and GV 220 conductors.

Row pump 410 may also provide the high voltages for coupling (through output node 415) to the logic circuits 430 of the integrated circuit. These high voltages may be used by logic circuits 430 for many different purposes. In particular, these high voltages may be used to improve the performance of the logic circuits 430. For example, the high voltages generated by row pump 410 may enhance the transient characteristics of the speed path, which may include high voltage switches, pass gates, and other logic elements.

Figure 5:
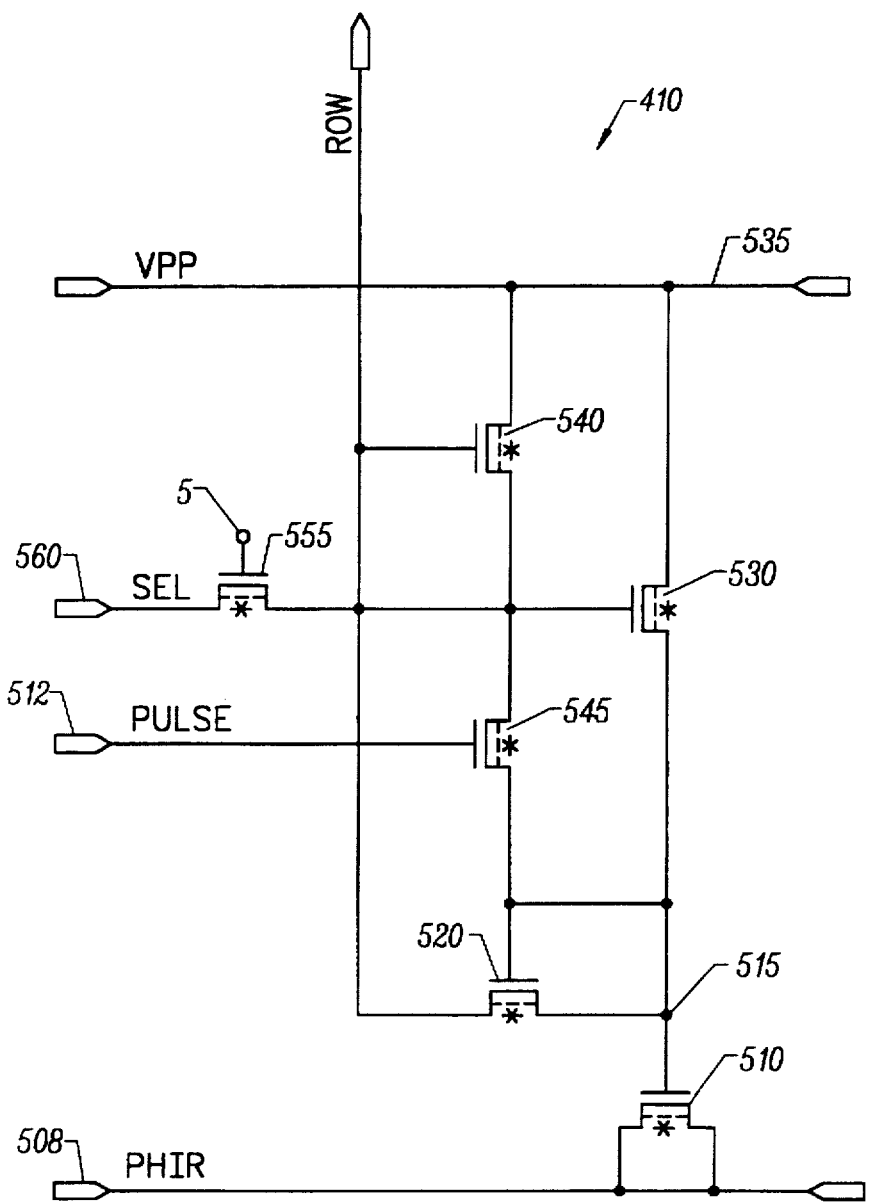
FIG. 5 is a circuit diagram for a single-stage high voltage pump of the present invention.

FIG. 5 is a circuit diagram for a single-stage high voltage pump of the present invention. This circuit is an implementation of row pump 410 of FIG. 4. One terminal of a capacitor 510 is coupled to a node 515, while the other terminal is coupled to a control node 508 for receiving a control signal 408 from an oscillator 405. Capacitor 510 may be fabricated using many different technologies. In the embodiment shown in FIG. 5, capacitor 510 is formed using an NMOS transistor where a gate is one terminal coupled to node 515, while a source and a drain of this transistor is the second terminal coupled to control node 508. A transistor 520 is coupled between node 515 and output node 415. A gate of transistor 520 is coupled to node 515. As discussed earlier, output node 415 is the node that will receive and output the high voltages generated by row pump 410. A transistor 530 is coupled between node 515 and a VPP node 535. A gate of transistor 530 is coupled to output node 415. A transistor 540 is coupled between VPP node 535 and output node 415. A gate of transistor 540 is coupled to output node 415. A transistor 545 is coupled between output node 415 and node 515. A gate of transistor 545 is coupled to a pulse node 512 for receiving a pulse signal 612. A transistor 555 is coupled between output node 415 and a select node 560. A gate of transistor 555 is coupled to a voltage level of about VDD at node 5.

In one embodiment, transistors 520, 530, 540, 545, 555, and 510 are similar types of devices. More specifically, these devices may be n-type MOS (or NMOS) transistors. In the fabrication of these transistors, the NMOS transistors of row pump 410 do not require additional implants or the absence of implants to differentiate the threshold voltage (VT) of these devices compared to other devices on the integrated circuit. For example, a native device is a transistor device that does not have a special VT adjust implant. The VT of a native device is typically about 0.3 volts, as opposed to 0.7 volts for an enhancement-type device. If the process cannot produce a reliable low VT device, the present invention may be used to provide a voltage generator where higher VT devices are utilized. Although a native device may be used to implement capacitor 510 to allow pump operation when node 515 is initially at a voltage less than VDD–VT, a native device has special processing and layout considerations, as well as other disadvantages. Therefore, among other advantages, the initiation scheme of the present invention provides a voltage generator where substantially similar transistor devices are used.

The transistor characteristics of transistors 520, 530, 540, 545, 555, and 510 are similar to another, as well as similar to other devices of the integrated circuit, which allows these devices to track one another to provide greater process tolerance. Matching of the electrical characteristics and device characteristics through similar device processing, sizing, and layout allow the present design greater tolerance due to processing and other variations. Overall, these considerations help to provide a degree of robustness to the present design.

Figure 6:
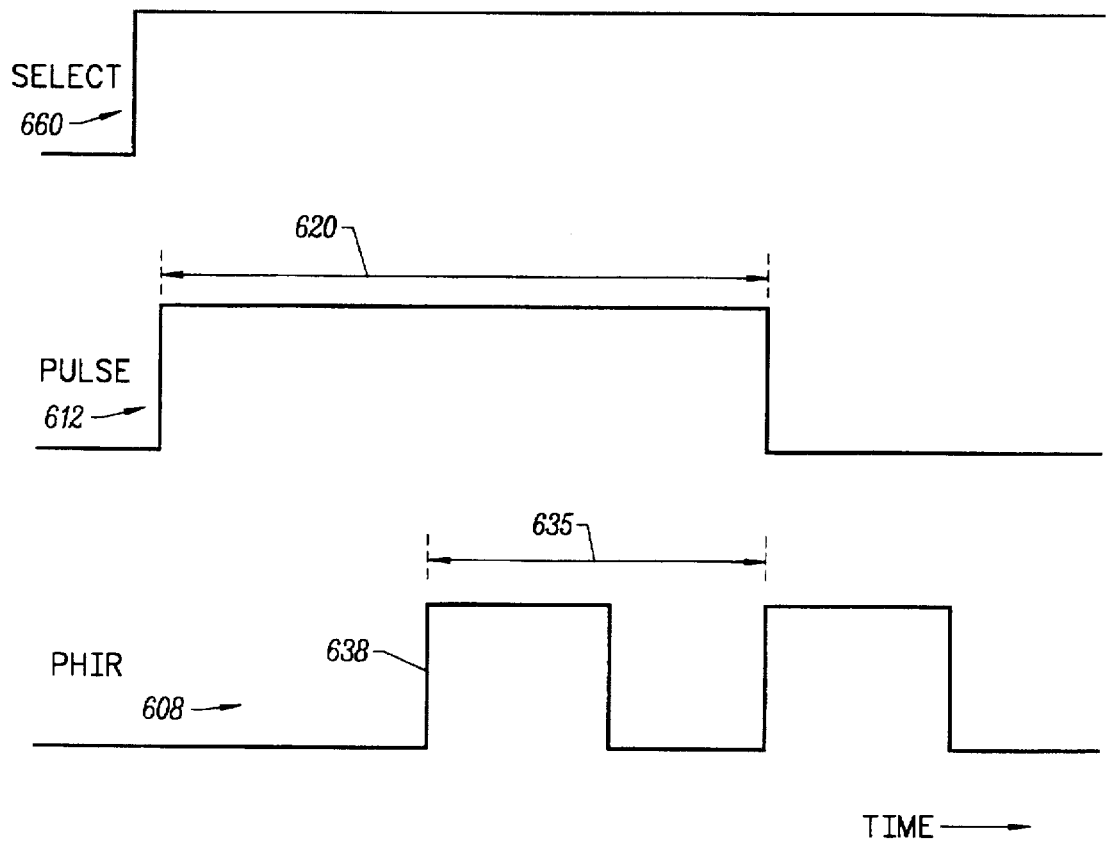
FIG. 6 is a timing diagram for a single-stage high voltage pump of the present invention.

FIG. 6 shows a timing diagram for the single-stage high voltage pump 410 of FIG. 5. In operation, a select signal 660 is placed at select node 560. Select node 560 is raised from the second voltage level to the first voltage level. Consequently, output node 415 will approximately equal the select voltage minus VT, or about VDD–VT when pumping begins. Select signal 660 remains at the first voltage level (high) throughout the duration of pump operation.

A pulse signal 612 is placed at pulse node 512. Pulse signal 612 is initially at the second voltage level, raised to the first voltage level for duration 620, and then returns to the second voltage level. Pulse signal 612 initializes the operation of the pump. Pumping does not begin unless node 515 is at a sufficiently high voltage, above about VDD–2 VT. More specifically, capacitor 510 will not be able to sufficiently couple charge through to node 515 unless node 515 is above about VDD–2 VT. Therefore, the duration 620 of this pulse is not especially critical, but only needs to be long enough to pass about VDD–VT from output node 415 through transistor 545 to node 515. A voltage of approximately VDD–VT on node 515 is sufficient to allow pumping to begin through capacitor 510.

In order to generate high voltages, a PHIR signal 608 at control node 508 should begin pumping while node 515 is at least about VDD–2 VT or above. Initially, the voltage of node 515 is about VDD–VT. Because of the capacitance at node 515, this voltage will remain above VDD–2 VT for a period of time, although this period may be relatively brief. Row pump 410 begins charge pumping on a falling edge of pulse signal 612, when pulse 612 returns to a logic low. In one embodiment, pulse signal 612 may remain high for a portion of a clock cycle of PHIR signal 608. In another embodiment, as shown in FIG. 6, pulse signal 612 may remain high for at least about one clock cycle of PHIR signal 608. In a further embodiment, after pulse signal 612 returns to the second voltage level (logic low), oscillator 405 begins generating the PHIR signal 608 a period of time later, but sufficiently short in duration that node 515 remains at least about VDD–2 VT or above. In a still further embodiment, oscillator 405 may already be generating a PHIR signal 608 and pulse 612 is used to initiate pump operation while PHIR signal 608 is oscillating.

In operation, PHIR signal 608 is a clock signal alternating between the first voltage level and the second voltage level at a certain frequency and period 635. PHIR signal 608 is capacitively coupled through capacitor 510 to node 515. On a rising edge 638 of PHIR signal 608, the voltage or charge at node 515 is boosted by an amount proportional to the change in voltage between the first and second voltage levels, which is typically approximately VDD.

Depending on the fabrication process used and the characteristics of the particular devices, capacitor 510 has a coupling ratio, which indicates its efficiency at coupling charge from one terminal to the other. In typical integrated circuits, the coupling ratio of capacitor 510 is about 80 percent, although lower and higher coupling ratios are also possible, which will also work with the present invention.

When pulse signal 612 falls, an oscillating PHIR signal 608 allows voltage pumping, separating nodes 415 and 515. After a subsequent iteration (or period 635) of PHIR signal 608, node 515 will be raised a voltage approximately 80 percent of VDD above the charge or voltage already at node 515. For example, since at the first iteration, node 515 is already at about VDD–VT, on the next rising edge of PHIR signal 608, the voltage at node 515 will be boosted an additional 80 percent of VDD (i.e., VDD–VT+ (80%*VDD)). While PHIR signal 608 is high, the charge or voltage at node 515, minus a VT, is passed through transistor 520 to output node 415. When PHIR signal 608 returns low, transistor 520 does not allow charge from output node 415 to return to node 515. The charge at node 515 is refreshed by a charge from VPP node 535. The voltage at VPP node 535 is normally at or above the second voltage level. In some embodiments, VPP node 535 is a high voltage level (e.g., 13 volts) generated by another high voltage pump, external or internal to the integrated circuit.

During each successive iteration of the pump, node 515 is continually boosted and charge is continually transferred to output node 415. Output node 415 continues to collect charge, and its voltage will gradually rise accordingly. Theoretically, the voltage at output node 415 can be raised to any arbitrarily high voltage level. However, in practice, there may be some parasitic devices or transistors along output node 415 that breaks down at a breakdown voltage. However, in the embodiment shown in FIG. 5, transistor 540 limits the voltage at output node 415 to the voltage at VPP node 535 plus a VT. This embodiment is useful when a relationship must be maintained between the VPP node 535 voltage and the output node 415 voltage. Such a relationship may be useful when programming memory cells. For example, if the VPP node 535 voltage is 13 volts and a VT is approximately 1.5 volts, then the output node 415 voltage will be limited to about 14.5 volts. In some integrated circuits, two high voltages, one at 14.5 volts and another at about 13 volts is necessary to program programmable cells 420. For example, output node 415 may be used to turn on a pass gate used to pass the VPP node 535 voltage to a row of memory cells. In order to pass a full-level VPP node 535 voltage to the memory cells, the gate of the pass gate must be elevated to the VPP node 535 voltage plus a VT. In other embodiments of the present invention where such a relationship is not necessary, transistor 540 may be omitted.

In a further embodiment, when transistor 540 is omitted, a transistor may be coupled between output node 415 and ground in order to limit the high voltage output level to a transistor breakdown voltage. In many processes, the transistor breakdown voltage is approximately 13 volts. Furthermore, as output node 415 increases in voltage, this voltage is fed back through transistor 530 to node 515 to help maintain a high voltage on output node 415. Also, the gate of transistor 530 is coupled to output node 415 to ensure the full voltage level at VPP node 535 minus a VT may be passed through transistor 530.

Figure 7:
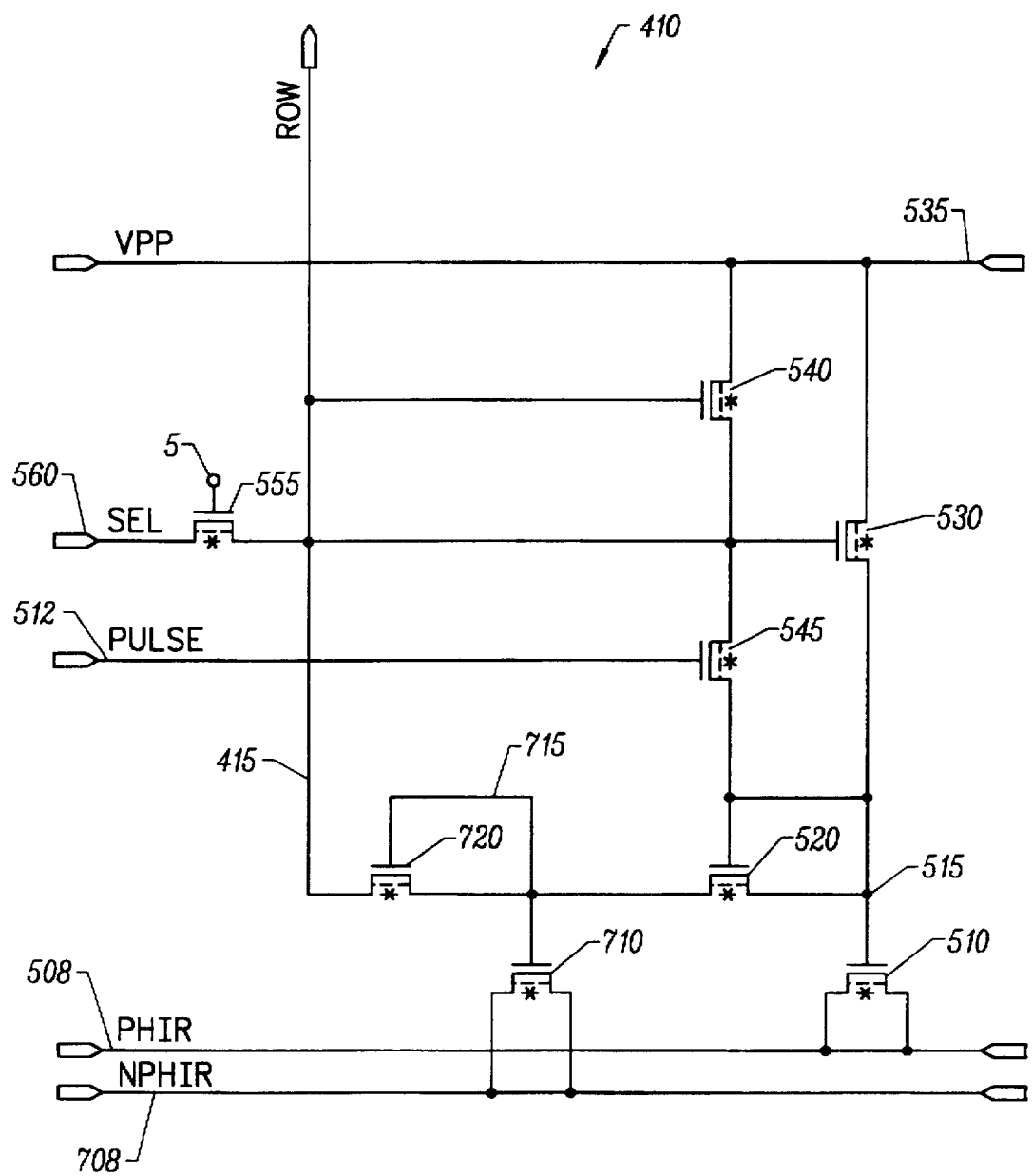
FIG. 7 is a circuit diagram for a two-stage high voltage pump of the present invention.

FIG. 7 is a circuit diagram for a two-stage high voltage pump of the present invention. Other multiple stage high voltage pumps of the present invention may be similarly designed and operated. This circuit is another implementation of row pump 410 of FIG. 4. Row pump 410 of FIG. 5 shares many similarities with row pump 410 of FIG. 7.

One terminal of a capacitor 510 is coupled to a node 515, while the other terminal is coupled to a control node 508 for receiving a first control signal PHIR from an oscillator 405. As discussed earlier, capacitor 510 may be fabricated using many different technologies. In the embodiment shown in FIG. 7, capacitor 510 is formed using an NMOS transistor where a gate is one terminal coupled to node 515, while a source and a drain of this transistor is the second terminal coupled to node 508. A capacitor 710 is also used in row pump 410 of FIG. 7. One terminal of capacitor 710 is coupled to a node 715, while the other terminal is coupled to a control node 708 for receiving a second control signal NPHIR from oscillator 405. Similar to capacitor 510, capacitor 710 may be fabricated using many different technologies. In the embodiment shown in FIG. 7, capacitor 710 is formed using an NMOS transistor where a gate is one terminal coupled to node 715, while a source and a drain of this transistor is the second terminal coupled to control node 708.

A transistor 520 is coupled between node 515 and node 715. A gate of transistor 520 is coupled to node 515. A transistor 720 is coupled between node 715 and output node 415. A gate of transistor 720 is coupled to node 715. Output node 415 will receive and output the high voltages generated by row pump 410. A transistor 530 is coupled between node 515 and a VPP node 535. A gate of transistor 530 is coupled to output node 415. A transistor 540 is coupled between VPP node 535 and output node 415. A gate of transistor 540 is coupled to output node 415. A transistor 545 is coupled between output node 415 and node 515. A gate of transistor 545 is coupled to a pulse node 512. A transistor 555 is coupled between output node 415 and a select node 560. A gate of transistor 555 is coupled to a voltage level of about VDD at node 5.

In one embodiment, transistors 520, 530, 540, 720, 545, 555, 510, and 710 are similar types of devices. More specifically, these devices may be n-type MOS (or NMOS) transistors. Furthermore, in the fabrication of these transistors, the NMOS transistors of row pump 410 do not require additional implants or the absence of implants to differentiate the threshold voltage (VT) of these devices compared to other devices on the integrated circuit. The transistor characteristics of transistors 520, 530, 540, 720, 545, 555, 510, and 710 are similar to another, as well as similar to other devices of the integrated circuit.

Matching of the electrical characteristics and device characteristics through similar device processing, sizing, and layout allow the present design greater tolerance due to processing and other variations. Overall, these considerations help to provide a degree of robustness to the present design.

Figure 8:
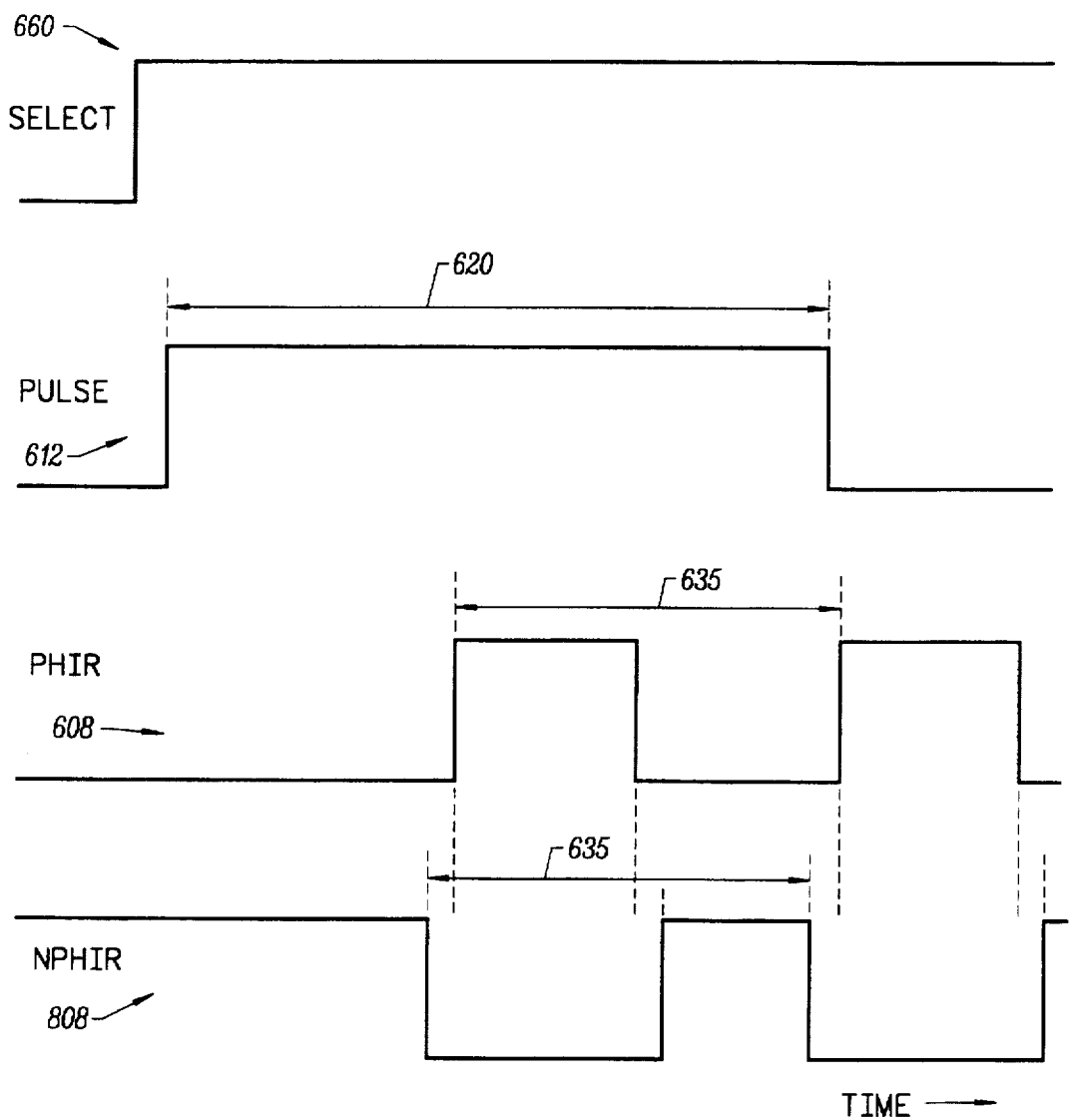
FIG. 8 is a timing diagram for a two-stage high voltage pump of the present invention.

FIG. 8 shows a timing diagram for the two-stage high voltage pump 410 of FIG. 7. In operation, a select signal 660 is placed at select node 560. Select node 560 is raised from the second voltage level to the first voltage level, and remains at this level during pump operation. Consequently, output node 415 will approximately equal the select voltage minus VT, or about VDD–VT.

A pulse signal 612 is placed at pulse node 512 to initialize the voltage pump. Pulse signal 612 is initially at the second voltage level, raised to the first voltage level for duration 620, and then returns to the second voltage level. The duration 620 of this pulse is not critical, but only needs to be long enough to pass the VDD–VT voltage at output node 415 through transistor 545 to node 515. Also, as shown in FIG. 8, select signal 660 remains at the first voltage level (high) throughout the duration of pulse signal 615. After pulse signal 615 is high, node 515 will approximately equal VDD–VT. In this manner, pulse signal 615 initializes node 515 of row pump 410. Without proper initialization of node 515, row pump 410 will be unable to generate high voltages. More specifically, capacitor 510 will not sufficiently couple charge through to node 515. A voltage of approximately VDD–VT on node 515 is sufficient to allow pumping through capacitor 510.

A PHIR signal 608 at control node 508 should begin pumping while node 515 is at least about VDD–2 VT or above. Initially, the voltage of node 515 is about VDD–VT. Because of the capacitance at node 515, this voltage will remain above VDD–2 VT for a period of time, although this period may be relatively brief. Row pump 410 begins charge pumping on a falling edge of pulse signal 612, when pulse 612 returns to a logic low. In one embodiment, pulse signal 612 may remain high for a portion of a clock cycle of PHIR signal 608. In another embodiment, as shown in FIG. 7, pulse signal 612 may remain high for at least about one clock cycle of PHIR signal 608. In a further embodiment, after pulse signal 612 returns to the second voltage level (logic low), oscillator 405 begins generating the PHIR signal 608 a period of time later, but sufficiently short in duration that node 515 remains at least about VDD–2 VT or above. In a still further embodiment, oscillator 405 may already be generating a PHIR signal 608 and pulse 612 is used to initiate pump operation while PHIR signal 608 is oscillating.

In operation, oscillator 405 begins generating a PHIR signal 608 and an NPHIR signal 808. The NPHIR signal 808 is typically the inverse of the PHIR signal 608. The PHIR signal 608 is placed at first control node 508, and the NPHIR signal 708 is placed at second control node 708. PHIR signal 608 and NPHIR signal 808 are typically clock signals alternating between the first voltage level and the second voltage level at a certain frequency and period 635. In one embodiment, PHIR signal 608 and NPHIR signal 808 are out-of-phase and the edges do not overlap. More specifically, the falling edge of NPHIR signal 808 occurs before the rising edge of PHIR signal 608. And the falling edge of PHIR signal 608 occurs before the rising edge of NPHIR signal 808. This relationship between NPHIR signal 808 and PHIR signal 608 provides for efficient operation of row pump 410. In some embodiments, PHIR signal 608 and NPHIR signal 808 may overlap or partially overlap.

The PHIR signal 608 is capacitively coupled through capacitor 510 to node 515. On a rising edge of PHIR signal 608, the voltage or charge at node 515 is boosted by an amount proportional to the change in voltage between the first and second voltage levels, which is approximately VDD. Similarly, the NPHIR signal 808 is capacitively coupled through capacitor 710 to node 715. On a rising edge of NPHIR signal 808, the voltage or charge at node 715 is boosted by an amount proportional to the change in voltage between the first and second voltage levels, which is approximately VDD.

Depending on the fabrication process used and the characteristics of the particular devices, capacitors 510 and 710 have a coupling ratio, which indicates its efficiency at coupling charge from one terminal to the other. In typical integrated circuits, the coupling ratio of capacitors 510 and 710 is about 80 percent, although higher coupling ratios are also possible.

After one iteration (or period 635) of row pump 410, node 515 will be raised a voltage approximately 80 percent of VDD above the charge or voltage already at node 515. For example, since at the first iteration, node 515 is already at VDD–VT, on the next rising edge of PHIR signal 608, the node 515 voltage will be boosted an additional 80 percent of VDD (i.e., VDD–VT+(80%*VDD)). While PHIR signal 608 is high, the charge or voltage at node 515, minus a VT, is passed through transistor 520 to node 715. When PHIR signal 608 returns low, transistor 520 does not allow charge from node 715 to return to node 515. The charge at node 515 is refreshed by a charge from VPP node 535. The voltage at VPP node 535 is normally at or above the first voltage level. In some embodiments, VPP node 535 is a high voltage level (e.g., 13 volts) generated by another high voltage pump, external or internal to the integrated circuit.

At the rising edge of NPHIR signal 808, node 715 will be raised a voltage approximately 80 percent of VDD above the charge or voltage already at node 715. For example, since at the first iteration, node 715 is already at VDD–2 VT+ (80%*VDD), during the next first iteration of the pump, the node 515 voltage will be boosted an additional 80 percent of VDD (i.e., VDD–2 VT+2*(80% * VDD)). While NPHIR signal 808 is high, the charge or voltage at node 715, minus a VT, is passed through transistor 720 to output node 415. When NPHIR signal 808 returns low, transistor 720 does not allow charge from output node 415 to return to node 715. As shown above, during each iteration, a two-stage pump of FIG. 7 is somewhat more efficient than the single-stage pump of FIG. 5.

During each successive iteration of the pump, node 515 is continually boosted and charge is continually transferred to node 715. Then, node 715 is boosted and charge is continually transferred to output node 415. Output node 415 continues to collect charge, and its voltage will gradually rise accordingly. Theoretically, the voltage at output node 415 can be raised to any arbitrarily high voltage level. In practice, there may be some parasitic devices or transistors along output node 415 that breaks down at a breakdown voltage.

In the embodiment shown in FIG. 7, transistor 540 limits the voltage at output node 415 to the voltage at VPP node 535 plus a VT. This embodiment is useful when a relationship must be maintained between the VPP node 535 voltage and the output node 415 voltage. Such a relationship may be useful when programming memory cells. For example, if the VPP node 535 voltage is 13 volts and a VT is approximately 1.5 volts, then the output node 415 voltage will be limited to about 14.5 volts. In some integrated circuits, two high voltages, one at 14.5 volts and another at about 13 volts is necessary to program programmable cells 420. For example, output node 415 may be used to turn on a pass gate used to pass the VPP node 535 voltage to a row of memory cells. In order to pass a full-level VPP node 535 voltage to the memory cells, the gate of the pass gate must be elevated to the VPP node 535 voltage plus a VT. In other embodiments of the present invention where such a relationship is not necessary, transistor 540 may be omitted. In a further embodiment, when transistor 540 is omitted, a transistor may be coupled between output node 415 and ground in order to limit the high voltage at output node 415 to a transistor breakdown voltage. In many processes, the transistor breakdown voltage is approximately 13 volts. Furthermore, as output node 415 increases in voltage, this voltage is fed back through transistor 530 to node 515 to help maintain a high voltage on output node 415.

The foregoing description of preferred embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the claims appended hereto.

What is claimed is:

1. A method of generating voltages on an integrated circuit comprising:

generating a pulse signal, said pulse signal rising to a first voltage level from a second voltage level, and returning to said second voltage level after a pulse duration, wherein said first voltage level is above said second voltage level;

transferring an initiation voltage, through a pass transistor, to a first node of a voltage pump in response to said pulse signal coupled to said pass transistor;

charging said first node with said initiation voltage;

generating a first clock signal alternating between said first voltage level and said second voltage level while a voltage level at said first node is above a third voltage level;

generating a second clock signal alternating between said first voltage level and said second voltage level;

charging said first node of said voltage pump with said first clock signal;

transferring a charge of said first node of said voltage pump to a second node of said voltage pump;

charging said second node of said voltage pump with said second clock signal;

transferring a charge of said second node of said voltage pump to a third node of said voltage pump; and producing a fourth voltage level at said third node by repeating said steps of charging said first node with said first clock signal, transferring charge to said second node, charging said second node, and transferring charge to said third node, wherein said fourth voltage level is above said first voltage level.

2. The method of claim 1 further comprising:

programming a memory cell with said fourth voltage level.

3. The method of claim 1 wherein said first clock signal is a complement of said second clock signal.

4. The method of claim 1 wherein said initiation voltage is provided to said first node for a duration sufficient to charge said first node to a level of about VDD–VT, wherein VDD is a supply voltage and VT is a threshold voltage of a transistor device.

5. The method of claim 1 wherein said charging said first node with said first clock signal occurs after beginning the charging of said first node with said initiation voltage.

6. The method of claim 1 wherein said first node is charged to about VDD–VT before said charging said first node with said first clock signal, wherein VDD is a supply voltage and VT is a threshold voltage of a transistor device.

7. A voltage pump circuit comprising:

a first transistor, coupled between a VPP node and a first node, wherein a gate of said first transistor is coupled to an output node;

a second transistor, coupled between said output node and said first node, wherein a gate of said second transistor is coupled to a pulse signal node;

a third transistor, coupled between said VPP node and said output node, wherein a gate of said third transistor is coupled to said output node;

a fourth transistor, coupled between said first node and said output node, wherein a gate of said fourth transistor is coupled to said first node; and a capacitor, coupled between said first node and a control signal node.

8. The voltage pump circuit of claim 7 wherein said first transistor, said second transistor, said third transistor, said fourth transistor, and said capacitor are substantially similar.

9. The voltage pump circuit of claim 7 wherein said second transistor transfers about VDD–VT to said first node to initiate pumping, wherein VDD is a supply voltage and VT is a threshold voltage of a transistor.

10. The voltage pump circuit of claim 7 wherein said output node is coupled to a memory cell.

11. The voltage pump circuit of claim 7 wherein said fourth transistor transfers charge from said first node to said output node.

12. A voltage pump circuit comprising:

a first transistor, coupled between a VPP node and a first node, wherein a gate of said first transistor is coupled to an output node;

a second transistor, coupled between said output node and said first node, wherein a gate of said second transistor is coupled to a pulse signal node, wherein said second transistor transfers a first voltage to said first node to initiate pumping;

a third transistor, coupled between said VPP node and said output node, wherein a gate of said third transistor is coupled to said output node;

a fourth transistor, coupled between said first node and a second node, wherein a gate of said fourth transistor is coupled to said first node;

a first capacitor, coupled between said first node and a first clock signal node;

a fifth transistor, coupled between said second node and said output node, wherein a gate of said fifth transistor is coupled to said second node; and a second capacitor, coupled between said second node and a second clock signal node.

13. The voltage pump circuit of claim 12 further comprising a sixth transistor, coupled between said output node and a select node, wherein a gate of said sixth transistor is coupled to a voltage source.

14. The voltage pump circuit of claim 12 wherein said first voltage is at least VDD–2 VT, wherein VDD is a supply voltage and VT is a threshold voltage of a transistor.

15. The voltage pump circuit of claims 7 or 12 wherein a voltage at said output node is limited by a breakdown voltage of a another transistor coupled between said output node and ground.

* * * * *